US008766526B2

(12) United States Patent
Cho

(10) Patent No.: US 8,766,526 B2
(45) Date of Patent: Jul. 1, 2014

(54) LIGHT-EMITTING DEVICE PACKAGE PROVIDING IMPROVED LUMINOUS EFFICACY AND UNIFORM DISTRIBUTION

(75) Inventor: Bumchul Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 146 days.

(21) Appl. No.: 13/169,466

(22) Filed: Jun. 27, 2011

(65) Prior Publication Data

US 2011/0316409 A1  Dec. 29, 2011

(30) Foreign Application Priority Data

Jun. 28, 2010 (KR) .................. 10-2010-0061531
Jul. 28, 2010 (KR) .................. 10-2010-0072997

(51) Int. Cl.
| | | |
|---|---|---|
| H01J 1/62 | (2006.01) | |
| H01K 1/30 | (2006.01) | |
| G02B 27/09 | (2006.01) | |
| H01L 33/52 | (2010.01) | |
| H01L 33/50 | (2010.01) | |

(52) U.S. Cl.
CPC .......... *G02B 6/0025* (2013.01); *G02B 27/0972* (2013.01); *H01L 33/52* (2013.01); *H01L 33/50* (2013.01)
USPC .......................................... 313/498; 313/152

(58) Field of Classification Search
None
See application file for complete search history.

(56) References Cited

U.S. PATENT DOCUMENTS

| | | | | |
|---|---|---|---|---|
| 6,610,598 | B2 * | 8/2003 | Chen .............................. | 438/666 |
| 7,210,806 | B2 * | 5/2007 | Holman et al. ................. | 362/19 |
| 2002/0039001 | A1 * | 4/2002 | Nagai et al. .................... | 313/512 |
| 2002/0163728 | A1 * | 11/2002 | Myers ............................ | 359/613 |
| 2002/0180909 | A1 * | 12/2002 | Lubart et al. .................. | 349/113 |
| 2003/0058390 | A1 * | 3/2003 | Fujii .............................. | 349/113 |
| 2004/0036990 | A1 * | 2/2004 | Hanano ......................... | 359/831 |
| 2005/0134963 | A1 * | 6/2005 | Stevenson et al. ............. | 359/600 |
| 2006/0083004 | A1 * | 4/2006 | Cok ............................... | 362/330 |
| 2006/0103777 | A1 * | 5/2006 | Ko et al. ......................... | 349/65 |
| 2006/0182409 | A1 * | 8/2006 | Sudol ............................. | 385/146 |
| 2006/0269214 | A1 * | 11/2006 | Sudol ............................. | 385/146 |
| 2006/0285332 | A1 * | 12/2006 | Goon et al. .................... | 362/327 |
| 2007/0001182 | A1 * | 1/2007 | Schardt et al. .................. | 257/98 |
| 2007/0008738 | A1 * | 1/2007 | Han et al. ....................... | 362/607 |
| 2007/0236938 | A1 * | 10/2007 | Ouderkirk et al. ............. | 362/339 |
| 2007/0242479 | A1 * | 10/2007 | Ohta et al. ..................... | 362/627 |

(Continued)

FOREIGN PATENT DOCUMENTS

| | | |
|---|---|---|
| CN | 1896777 A | 1/2007 |
| CN | 101122703 A | 2/2008 |

(Continued)

*Primary Examiner* — Britt D Hanley
(74) *Attorney, Agent, or Firm* — Birch, Stewart, Kolasch & Birch, LLP

(57) ABSTRACT

Disclosed is a light-emitting device package including; a body having a cavity formed therein, a light source mounted in the cavity, a resin layer which fills the cavity and is transmissive, and at least one optical sheet provided on the resin layer, wherein the optical sheet includes a first layer, and a second layer which is provided on the first layer and has a plurality of linear prisms, wherein the first layer has a first refractive index and the resin layer has a second refractive index, and wherein the first refractive index is equal to or greater than the second refractive index. Accordingly, the light-emitting device package may have improved luminous efficacy, enable uniform distribution of emitted light, and prevent degradation of a phosphor.

20 Claims, 17 Drawing Sheets

(56) References Cited

U.S. PATENT DOCUMENTS

| | | | |
|---|---|---|---|
| 2007/0258247 A1* | 11/2007 | Park et al. | 362/326 |
| 2008/0012034 A1* | 1/2008 | Thielen et al. | 257/98 |
| 2008/0153008 A1* | 6/2008 | Hayashi et al. | 430/2 |
| 2009/0135335 A1* | 5/2009 | Lee et al. | 349/64 |
| 2009/0154157 A1* | 6/2009 | Sah | 362/235 |
| 2009/0214828 A1* | 8/2009 | Watkins et al. | 428/156 |
| 2009/0303413 A1* | 12/2009 | Ohta et al. | 349/62 |
| 2011/0248238 A1* | 10/2011 | Yoon et al. | 257/13 |

FOREIGN PATENT DOCUMENTS

| | | |
|---|---|---|
| JP | 2008-71837 A | 3/2008 |
| JP | 2010-130000 A | 6/2010 |
| KR | 10-2006-0066773 A | 6/2006 |
| KR | 10-2007-0102089 A | 10/2007 |

* cited by examiner

140

140

LIGHT-EMITTING DEVICE PACKAGE PROVIDING IMPROVED LUMINOUS EFFICACY AND UNIFORM DISTRIBUTION

CROSS-REFERENCE TO RELATED APPLICATION

This application claims the priority benefit of Korean Patent Application No. 10-2010-0061531, filed on Jun. 28, 2010 in the Korean Intellectual Property Office and the priority benefit of Korean Patent Application No. 10-2010-0072997, file on Jul. 28, 2010 in the Korea Intellectual Property Office, the disclosure of which is incorporated herein by reference.

BACKGROUND

1. Field

Embodiments relate to a light-emitting device package.

2. Description of the Related Art

A light-emitting diode (LED) is a device which converts electric signals into light using characteristics of compound semiconductors. LEDs are now being applied to devices such as home appliances, remote controls, electronic signboards, displays, a variety of automatic appliances and the like and their application range continues to expand.

Generally, a miniaturized LED is fabricated as a surface mount device such that it can be directly mounted to a printed circuit board (PCB). Accordingly, an LED lamp used as a display device is also developed in a surface mount device-type. Such a surface mount device may substitute for a conventional lamp and is used as lighting displays, character displays, image displays and the like, rendering various colors.

Meanwhile, a light-emitting device package provided with LEDs typically uses luminescent materials (often, referred to as 'phosphors') based on the LEDs, to realize white light, however, due to settling of the phosphor, light distribution and/or uniformity of color coordinates may be deteriorated. Further, light generated by the phosphors in the LEDs may necessitate modification of the package.

SUMMARY

Therefore, embodiments disclosed herein provide a light-emitting device package providing improved luminous efficacy and uniform distribution of light emitted by a light emitting device in the package.

According to one embodiment, there is provided a light-emitting device package, including; a body having a cavity formed therein, a light source mounted in the cavity, a resin layer which fills the cavity and is transmissive, and at least one optical sheet provided on the resin layer: wherein the optical sheet includes a first layer, a second layer which is provided on the first layer and has a plurality of linear prisms; wherein the first layer has a first refractive index and the resin layer has a second refractive index; and wherein the first refractive index is equal to or greater than the second refractive index.

In one embodiment, the plural linear prisms may form prism patterns arranged in parallel to one another.

In one embodiment, the linear prisms may have a pitch of 30 to 70 μm.

In one embodiment, each linear prism may have a height of 20 to 40 μm.

In one embodiment, the optical sheet may further include a third layer formed at the bottom of the first layer.

In one embodiment, the optical sheet may comprise at least one selected from polyethylene terephthalate, polycarbonate, polyethylene, polystyrene, polyester resin, polyether resin, epoxy resin, urethane resin, spiroacetyl resin, polybutadiene resin, polythiolpolyene resin, or the like.

In one embodiment, the optical sheet may include; a first optical sheet and a second optical sheet provided on the first optical sheet, wherein the first optical sheet has a first prism part arranged in a first direction while the second optical sheet has a second prism part arranged in a second direction, and wherein the first and second directions form a first angle.

In one embodiment, the first angle may be a right angle.

According to one embodiment, there is provided a light-emitting device package, including; a body having a cavity formed therein, a light source mounted in the cavity, a resin layer which fills the cavity and is transmissive, and at least one optical sheet provided on the resin layer: wherein the optical sheet includes a first layer, a second layer which is provided on the first layer and has a plurality of linear prisms; and wherein any one of the first and second layers includes a phosphor.

In one embodiment, the optical sheet may further include a third layer provided under the first layer and arranged between the first layer and the resin layer.

In one embodiment, the third layer may include phosphors.

In one embodiment, the second layer may include a first phosphor, the third layer may include a second phosphor, and the first and second layers may emit different wavelengths of light.

In one embodiment, the optical sheet may include a first optical sheet and a second optical sheet provided on the first optical sheet: wherein the first optical sheet has a first prism part arranged in a first direction and the second optical sheet has a second prism part arranged in a second direction; and wherein the first and second directions form a first angle.

In one embodiment, the first angle may be a right angle.

According to one embodiment, there is provided a light-emitting device package, including; a body having a cavity formed therein, a light source mounted in the cavity, a resin layer which fills the cavity and is transmissive, and at least one optical sheet provided on the resin layer: wherein the optical sheet includes a first layer, a second layer which is provided on the first layer and has a plurality of linear prisms; wherein the first layer includes a first phosphor while the second layer includes a second phosphor; and wherein the first and second phosphors emit different wavelengths of light.

In one embodiment, the optical sheet may further include a third layer provided under the first layer and arranged between the first layer and the resin layer.

In one embodiment, the third layer may include phosphors.

In one embodiment, the second layer may include a first phosphor while the third layer may include a second phosphor, and the first and second phosphors may emit different wavelengths of light.

In one embodiment, the optical sheet may comprise a first optical sheet and a second optical sheet provided on the first optical sheet, wherein the first optical sheet has a first prism part arranged in a first direction and the second optical has a second prism part arranged in a second direction, and wherein the first and second directions form a first angle.

In one embodiment, the first angle may be a right angle.

BRIEF DESCRIPTION OF THE DRAWINGS

The above and other features and other advantages of the embodiments disclosed herein will be more clearly understood from the following detailed description taken in conjunction with the accompanying drawings, in which.

DETAILED DESCRIPTION OF THE PREFERRED EMBODIMENTS

Figure 1A:
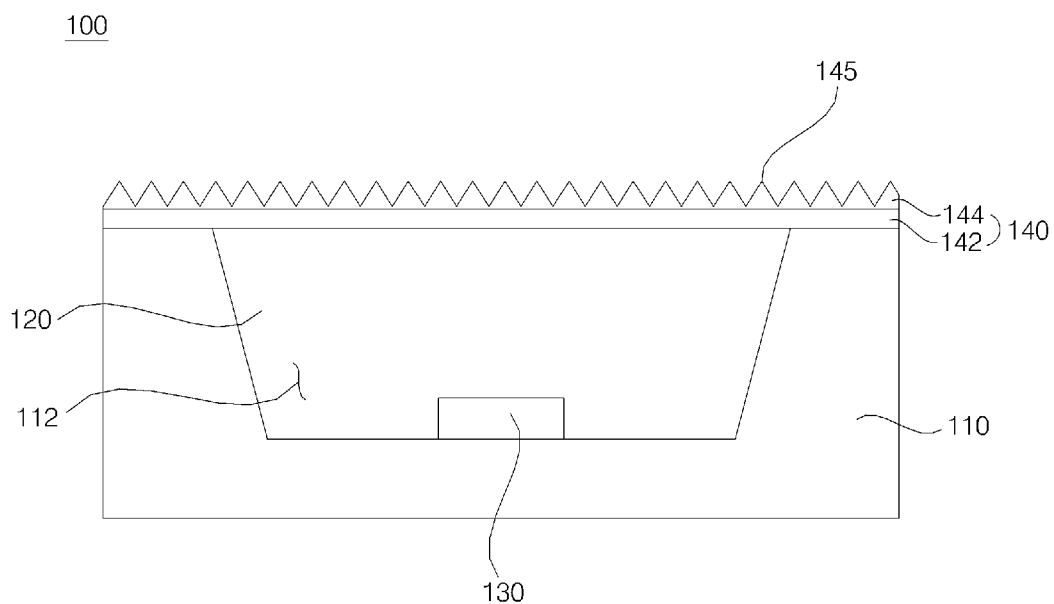
FIG. 1A is a cross-sectional view illustrating a configuration of a light-emitting device package according to one embodiment.

Prior to description of the embodiments, it will be understood that when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

In the drawings, thicknesses and/or sizes of respective layers may be enlarged, omitted or schematically illustrated for convenience of explanation or clarity. In addition, sizes of respective elements may not entirely reflect the real size thereof. Further, the same reference numbers will be used throughout the drawings to refer to the same or like parts.

Hereinafter, the present embodiment will be described in more detail with reference to the annexed drawings.

Figure 1B:
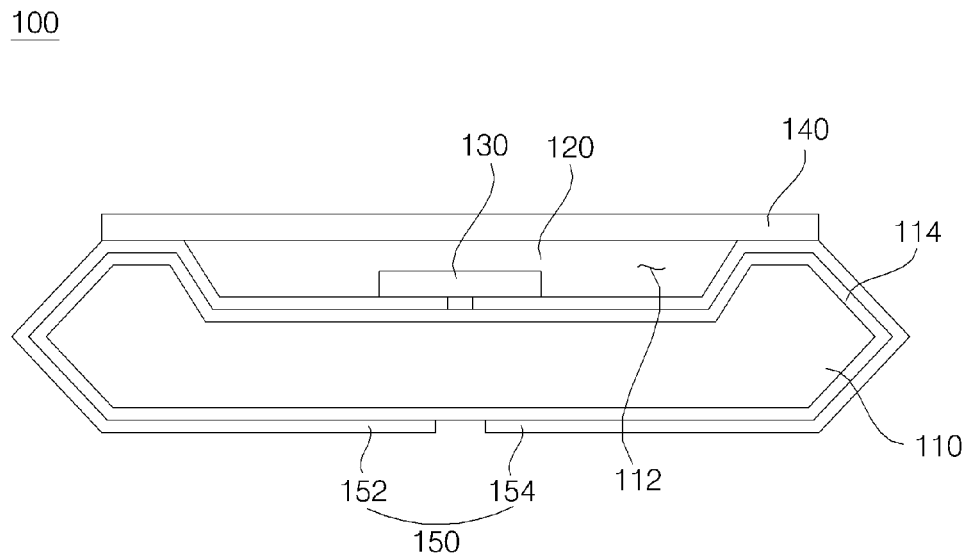
FIG. 1B is a cross-sectional view illustrating a configuration of a light-emitting device package according to another embodiment.
Figure 2:
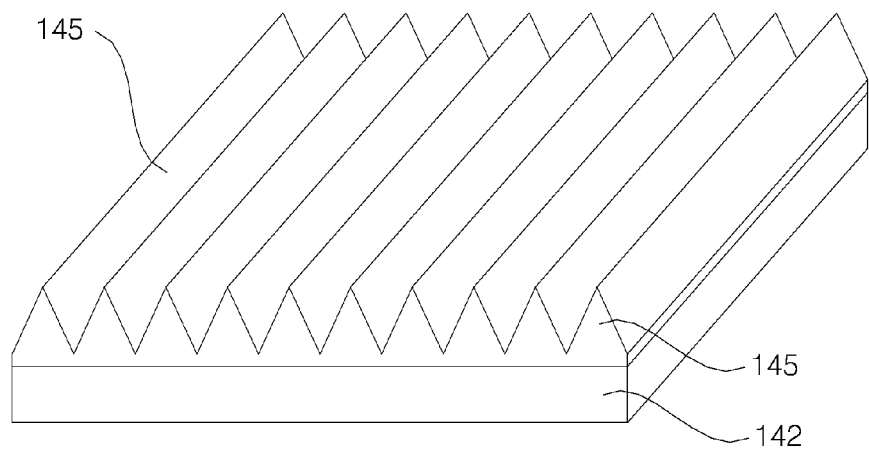
FIG. 2 is a perspective view illustrating a configuration of an optical sheet according to one embodiment.
Figure 3:
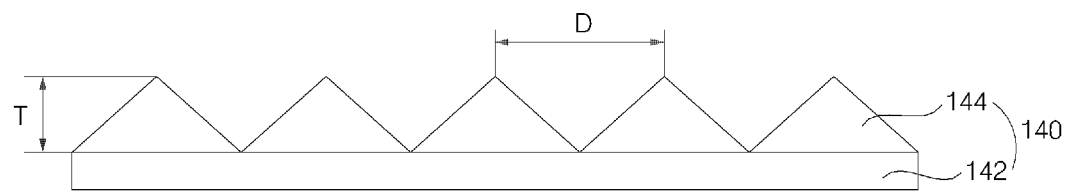
FIG. 3 is a cross-sectional view illustrating a configuration of an optical sheet according to one embodiment.
Figure 4:
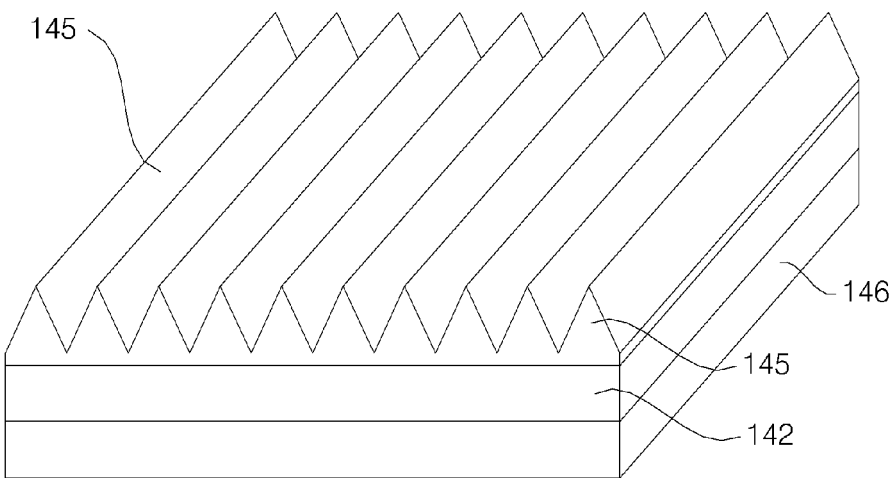
FIG. 4 is a perspective view illustrating a configuration of an optical sheet according to one embodiment.
Figure 5:
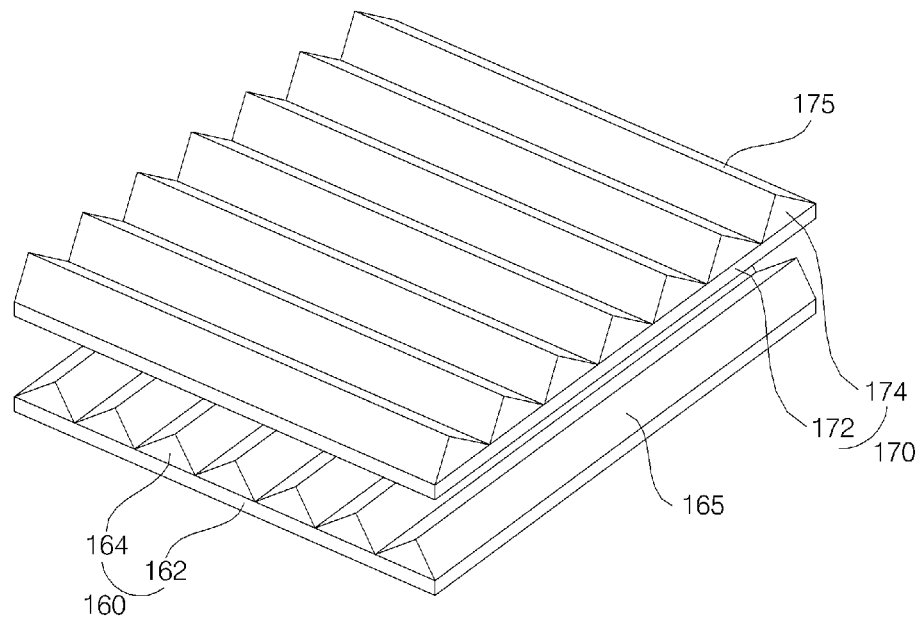
FIG. 5 is an exploded perspective view illustrating a configuration of an optical sheet according to one embodiment.

FIGS. 1A and 1B each are cross-sectional views illustrating a light-emitting device package according to one embodiment, FIG. 2 is a perspective view illustrating an optical sheet according to one embodiment, FIG. 3 is a cross-sectional view illustrating an optical sheet according to one embodiment, FIG. 4 is a perspective view illustrating an optical sheet according to one embodiment, and FIG. 5 is an exploded perspective view illustrating an optical sheet according to one embodiment.

Referring to FIG. 1A, a light-emitting device package 100 according to one embodiment comprises: a body 110 having a cavity 112 formed therein; a light source 130 mounted to the bottom of the body 110; a resin layer 120 which fills the cavity 112 and is transmissive; and an optical sheet 140 provided on the resin layer 120, wherein the optical sheet 140 has a first layer 142, a second layer 144 which is provided on the first layer 142 and includes a plurality of linear prisms 145, wherein the first layer 142 has a first refractive index and the resin layer 120 has a second refractive index, and wherein the first refractive index is equal to or greater than the second refractive index.

The body 110 may be formed using at least one selected from polyphthalamide (PPA) as a resin material, silicon (Si), aluminum (Al), aluminum nitride (AlN), photosensitive glass (PSG), polyaminde 9T (PA9T), syndiotactic polystyrene (SPS), metal materials, sapphire ($Al_2O_3$), beryllium oxide (BeO), a printed circuit board (PCB), or the like. The body 110 may be formed by injection molding, etching, etc., without being particularly limited thereto.

The inner surface of the body 110 may be provided with an inclined surface. The reflective angle of light emitted from the light source 130 may be varied, depending on the angle of the inclined surface. Accordingly, the orientation angle of light discharged to the outside can be controlled.

As the orientation angle of light decreases, convergence of light emitted by the light source 130 to the outside increases. On the other hand, as the orientation angle of light increases, convergence of light from the light source 130 to the outside decreases.

Meanwhile, as seen from the top, the cavity 112 provided in the body 110 may have various shapes including, but being not limited to, a circular shape, a rectangular shape, a polygonal shape, an oval shape and a shape with curved corners.

The light source 130 is mounted on bottom of the body 110 and an example of such light source 130 may be an LED.

The LED may include, without being limited to, color LEDs emitting red, green, blue or white light, or UV LEDs emitting ultraviolet light. Further, at least one LED may be mounted on the body.

The LED may be a horizontal type LED having electric leads provided on the top of the LED, or a vertical type LED having electric leads provided on the top and bottom of the LED.

Although not illustrated in the drawings, the body 110 may have an electrode (not shown). The electrode (not shown) may be electrically connected to the light source 130 to supply power.

The electrode (not shown) may comprise at least one selected from titanium (Ti), copper (Cu), nickel (Ni), gold (Au), chromium (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf), ruthenium (Ru), iron (Fe), or alloys thereof. The electrode (not shown) may be formed in a single layer or multi-layer structure, without being particularly limited thereto.

The cavity 112 may include the resin layer 120 having light transmitting property. More particularly, the cavity 112 may be filled with the resin layer 120 having light transmitting property to protect the light source 130 from impurities or moisture.

The resin layer 120 may be composed of silicone, epoxy or other resin materials and formed by filling the cavity 112 with such a resin material and UV or heat curing the same.

According to one embodiment, the light-emitting device package 110 may be a wafer level package, as shown in FIG. 1B.

Referring to FIG. 1B, a light-emitting device package 100 comprises; a body 110, an electrode layer 150 which is provided on the body and includes a first electrode layer 152 and a second electrode layer 154, a light emitting device 130 provided on the body 110, a resin layer 120 surrounding the light emitting device 130, and an optical sheet 140 placed on the light emitting device 130.

The body 110 may be made of an electrically insulating material, for example, resin, ceramic, a silicon wafer, etc. The body 110 made of a silicon wafer is illustrated in one embodiment.

A recess may be formed in a concave shape by selectively removing a top surface of the body 110. Within the recess, the light emitting device 130 is located and the resin layer 120 may be formed.

An insulating layer 114 may be formed on a surface of the body 110. The insulating layer 114 may prevent current leakage, to thereby improve electrical stability of the light-emitting device package 100. For example, the insulating layer 114 may be formed using a silicon oxide film obtained by oxidation of the body 110, without being particularly limited thereto.

The first and second electrode layers 152 and 154 may be provided on the insulating layer 114 and electrically isolated from each other. The first and second electrode layers 152 and 154 may extend from bottom of the body 110 to the recess formed on top of the body 110.

The light emitting device 130 may be placed in the recess of the body 110 and electrically connected to the first and second electrode layers 152 and 154, respectively. Although not illustrated, the light emitting devices 130 may be electrically connected to each other via a wire and, preferably, at least one wire.

The resin layer 120 may be placed in the recess of the body 110 while surrounding the light emitting device 130. The resin layer 120 may be a silicone resin or epoxy resin including phosphors. The resin layer 120 may have a flat top surface or a curved surface in a convex or concave form.

Referring to FIG. 1A, The body 110 may be provided with an optical sheet 140 and the optical sheet 140 may have a first layer 142 and a second layer 144 wherein the second layer 144 may have a plurality of linear prisms 145 formed thereon.

The optical sheet 140 may be made of light transmitting materials and may comprise, without being limited to, at least one selected from polyethylene terephthalate, polycarbonate, polyethylene, polystyrene, polyester resin, polyether resin, epoxy resin, urethane resin, spiroacetyl resin, polybutadiene resin, polythiolpolyene resin, or the like.

The first layer 142 may be provided as a support to form the second layer 144 thereon.

The resin layer 120 filling the cavity 112 may have a second refractive index while the first layer 142 of the optical sheet 140 may have a first refractive index, wherein the first refractive index may be equal to or greater than the second refractive index.

According to Snell's law (also known as the law of refraction), total reflection is a phenomenon in that, if an angle of incidence is greater than a critical angle when light moves from a material having a high refractive index to another material having a relatively lower refractive index, the light is reflected at a boundary between these materials having different refractive indices.

Therefore, in the case where the refractive index of the resin layer 120 is greater than that of the first layer 142, total reflection may occur at a boundary between the resin layer 120 and the first layer 142. Further, since light may be confined (entrapped) in the cavity 112, light extraction efficiency of the light-emitting device package 100 may be reduced.

According to one embodiment, the resin layer 120 may have a smaller refractive index than that of the first layer 142 to prevent total reflection at the boundary between the resin layer 120 and the first layer 142, thereby improving luminous efficacy of the light-emitting device package 100.

Meanwhile, the first layer 142 may be provided with a second layer 144 including a plurality of linear prisms 145 to refract light. The second layer 144 may be formed using acrylic resin, without being particularly limited thereto. For example, as described above, at least one selected from polyethylene terephthalate, polycarbonate, polyethylene, polystyrene, polyester resin, polyether resin, epoxy resin, urethane resin, spiroacetyl resin, polybutadiene resin, polythiolpolyene resin, or the like, may be used. Otherwise, the second layer 142 may be composed of the same material as the first layer 142 and integrated with the same, without being particularly limited thereto.

For instance, as shown in FIGS. 1A to 4, the linear prisms 145 may form a plurality of linear prism patterns which are adjacent to and arranged in parallel to one another along one direction, without being particularly limited thereto. Alternatively, a vertical cross-section of the linear prisms may take the shape of a triangle, without being particularly limited thereto.

A pitch 'D' between two adjacent linear prisms 145 in the second layer 144 may range from 30 to 70 μm, while a height 'T' of each linear prism may range from 20 to 40 μm. A refractive index of the second layer 145 may range from 1.41 to 1.53 and be equal to or greater than that of the resin layer 130, without being particularly limited thereto. Also, the second layer 144 may have a refractive index equal to that of the first layer 142, without being particularly limited thereto. The linear prisms 145 may form an isosceles triangle and, in this case, light scattering may be increased.

Since the optical sheet 140 having a plurality of linear prisms 145 formed thereon is provided on the light-emitting device package 100, luminance (brightness) and light distribution of the package 100 may be enhanced.

Referring to FIG. 4, a third layer 146 may be provided under the first layer 142.

The third layer 146 may be attached to the bottom of the first layer 142 and, for example, be formed using an acrylic resin having favorable transparency and excellent heat resistance and mechanical properties, thus improving heat resistance of the optical sheet 140. Such acrylic resin may include, for example, polyacrylate or polymethyl methacrylate, without being particularly limited thereto. For instance, the third layer 146 may comprise at least one selected from polyethylene terephthalate, polycarbonate, polyethylene, polystyrene, polyester resin, polyether resin, epoxy resin, urethane resin, spiroacetyl resin, polybutadiene resin, polythiolpolyene resin, or the like, without being particularly limited thereto.

The third layer 146 may prevent the optical sheet 140 from being modified by heat generated from the light source 130 and have excellent restoration, thus enabling the optical sheet 140 to return to an original shape thereof at room temperature, even when the optical sheet 140 is modified at high temperature.

Furthermore, the third layer 146 may protect the optical sheet 140 from being scratched due to external impact or other physical force.

Referring to FIG. 5, the optical sheet 140 according to one embodiment may include a first optical sheet 160 and a second optical sheet 170.

As described above, the first optical sheet 160 may have a first layer 162 and a second layer 164 or a third layer (not shown) while the second optical sheet 170 may have a first layer 172 and a second layer 174 or a third layer (not shown), without being particularly limited thereto.

The first optical sheet 160 and second optical sheet 170 may be secured to each other, using an adhesive, without being particularly limited thereto.

A first linear prism part 165 provided on the second layer 164 of the first optical sheet 160 may extend in a first direction, while a second linear prism part 175 provided on the second layer 174 of the second optical sheet 170 may extend in a second direction forming a first angle relative to the first direction. The first angle may be a right angle, without being particularly limited thereto.

For instance, after light is emitted by the light source 130 and enters the first and second optical sheets 160 and 170, the first and second optical sheets 160 and 170 may upwardly reflect 50% of the light oscillating in a direction, along which the light source 130 is arranged, thereby improving luminous efficacy. The first and second linear prism parts 165 and 175 provided on the first and second optical sheets 160 and 170, respectively, may increase refraction, thus improving luminous efficacy.

Figure 6:
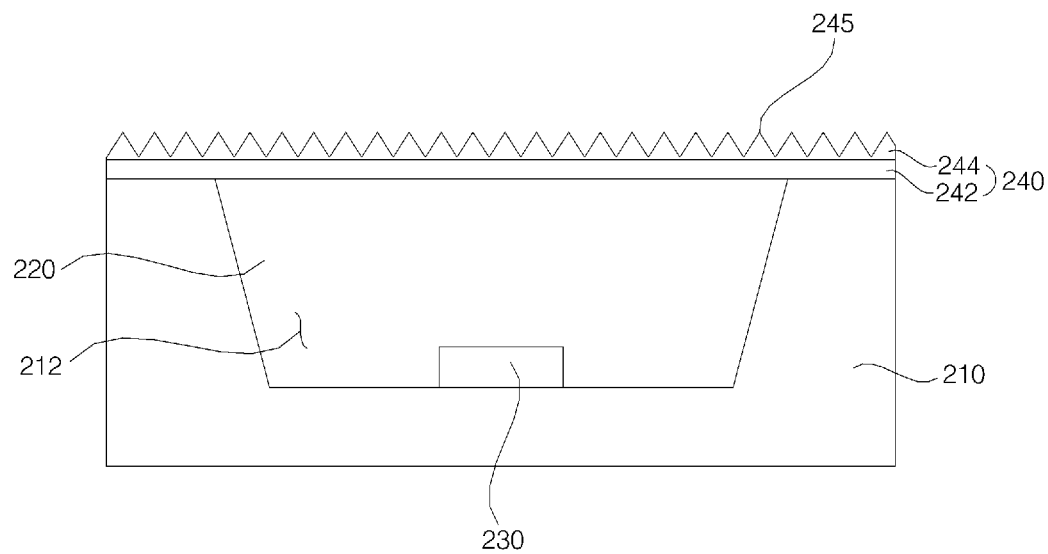
FIG. 6 is a cross-sectional view illustrating a configuration of a light-emitting device package according to one embodiment.
Figure 10:
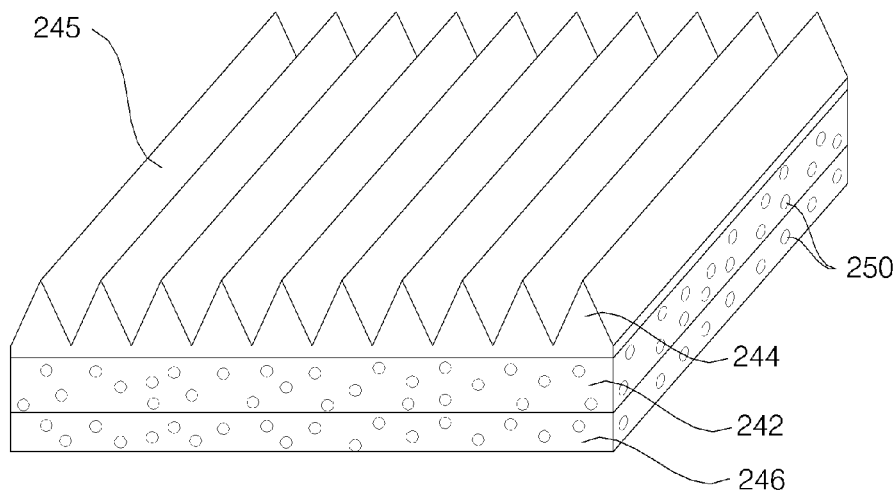
FIG. 10 is a perspective view illustrating a configuration of an optical sheet according to one embodiment.
Figure 11:
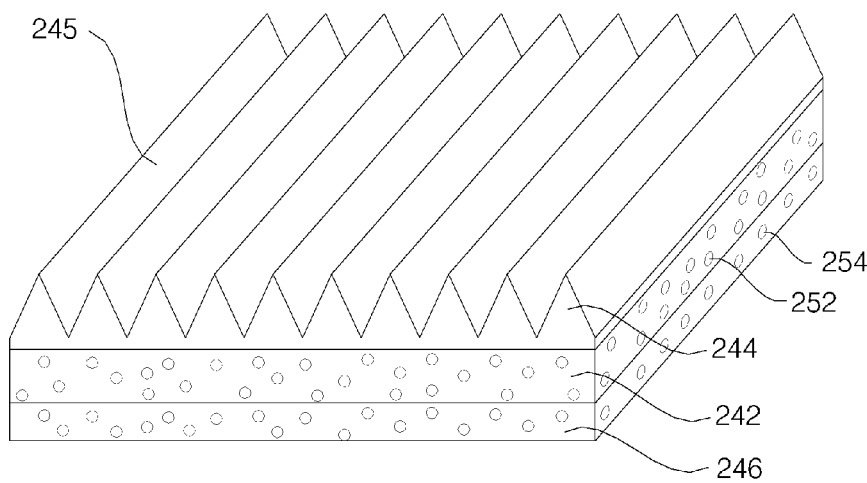
FIG. 11 is a perspective view illustrating a configuration of an optical sheet according to one embodiment.
Figure 12:
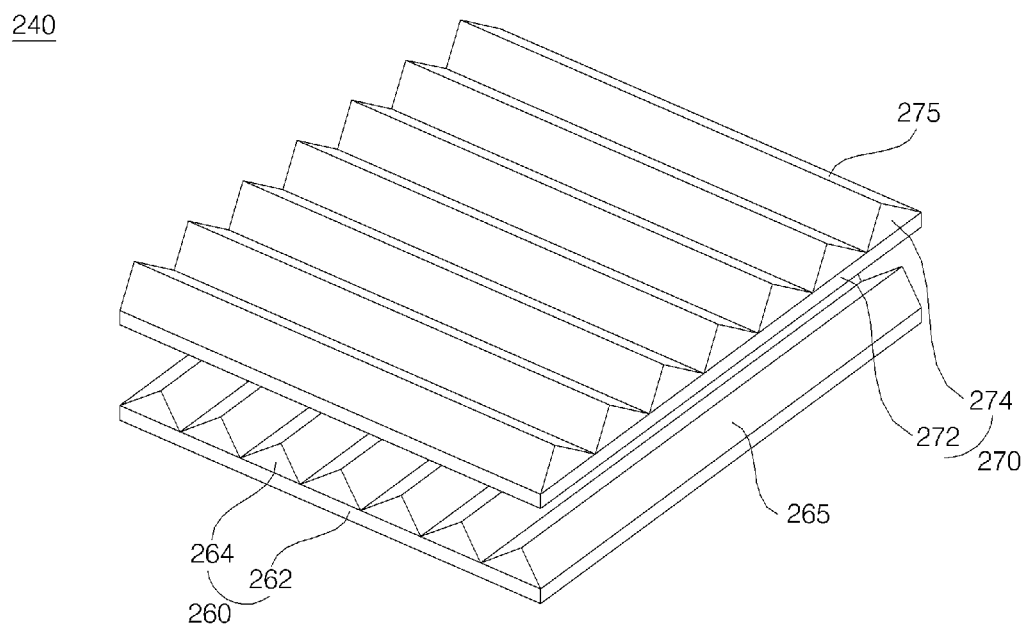
FIG. 12 is an exploded perspective view illustrating a configuration of an optical sheet according to one embodiment.

FIG. 6 is a cross-sectional view illustrating a configuration of a light-emitting device package according to one embodiment, FIGS. 7 to 11 are perspective views illustrating configurations of optical sheets according to the embodiments, and FIG. 12 is an exploded perspective view illustrating a configuration of an optical sheet according to one embodiment.

Referring to FIG. 6, a light-emitting device package 200 according to one embodiment comprises: a body 210 having a cavity 212 formed therein; a light source 230 mounted in the cavity 212; a resin layer 220 which fills the cavity 212 and is transmissive; and at least one optical sheet 240 provided on the resin layer 220, wherein each optical sheet 140 has a first layer 242, a second layer 244 which is provided on the first layer 242 and includes a plurality of linear prisms 245, and wherein any one of the first and second layers 242 and 244 includes a phosphor 250.

The body 210, cavity 212, resin layer 220 and light source 230 are substantially the same as described above and, therefore, a detailed explanation thereof is omitted.

Figure 7:
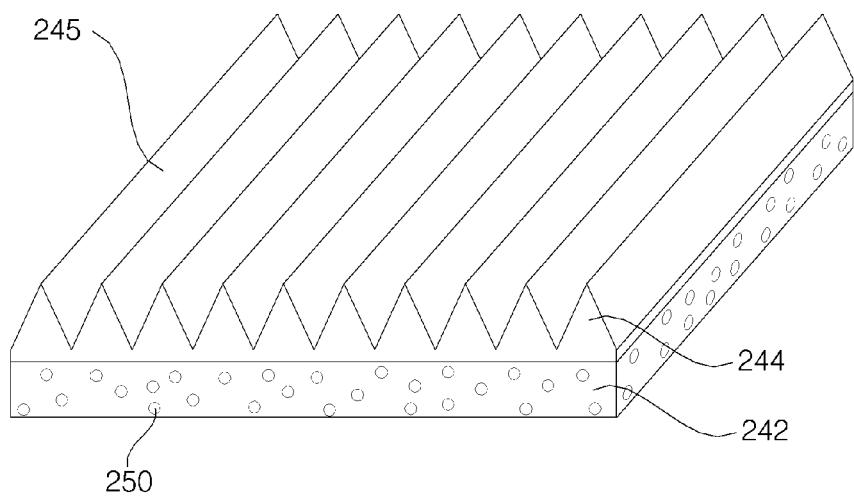
FIG. 7 is a perspective view illustrating a configuration of an optical sheet according to one embodiment.
Figure 8:
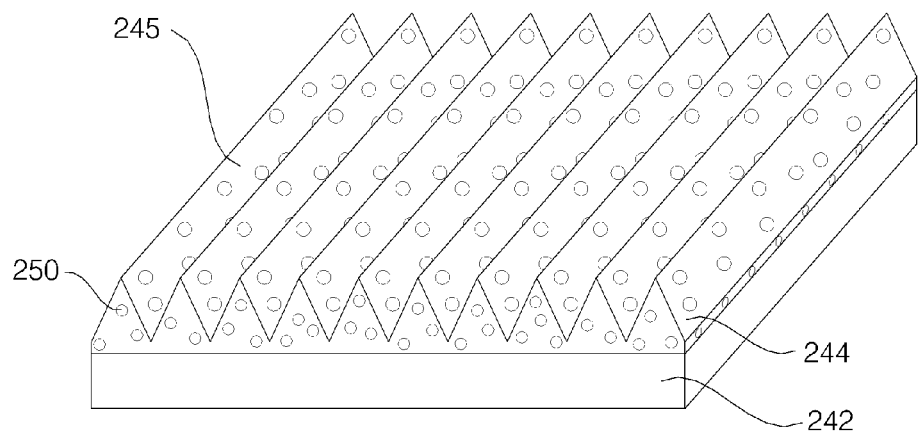
FIG. 8 is a perspective view illustrating a configuration of an optical sheet according to one embodiment.

As shown in FIGS. 7 and 8, the first or second layer 242 or 244 may have the phosphor 250.

For instance, the phosphor 250 is uniformly dispersed in a material used for the first or second layer 242 or 244 and then cured, resulting in the first or second layer 242 or 244. Accordingly, the phosphor 250 may be uniformly distributed in the first or second layer 242 or 244.

Types of the phosphor 250 may be suitably selected, considering the wavelength of light emitted by the light source 230, to allow the light-emitting device package 200 to produce white light.

The phosphor 250 may be any one selected from a blue light emitting phosphor, blue-green light emitting phosphor, green light emitting phosphor, yellow-green light emitting phosphor, yellow light emitting phosphor, yellow-red light emitting phosphor, orange light emitting phosphor and red light emitting phosphor, depending upon the wavelength of light emitted by the light source 230.

That is, the phosphor 250 is excited by first light emitted by the light source 230 to create second light. For instance, in the case where the light source 230 is a blue light emitting diode (LED) and the phosphor is a yellow phosphor, the yellow phosphor is excited by blue light to emit yellow light, and blue light emitted from the blue LED and yellow light excited from the blue light are combined, the light-emitting device package 200 may emit white light.

Similarly, if the light source 230 is a green LED, a magenta phosphor as well as blue and red phosphors may be employed together. Alternatively, when the light source 230 is a red LED, a cyan phosphor as well as blue and green phosphors may be employed together.

Such phosphor 250 may be any one commonly known in the art, such as YAG, TAG, sulfide, silicate, aluminate, nitride, carbide, nitride-silicate, borate, fluoride or phosphate based material, etc.

As described below, the phosphor 250 may be distributed in any one of the first layer 242 and the second layer 244 provided with a plurality of linear prisms 245.

As such, if the optical sheet 240 includes the phosphor 250, the distribution of the phosphor 250 may be uniform, which in turn improves uniformity and light distribution of the light emitted from the light-emitting device package 200 and protects particles of the phosphor 250 from being degraded by heat generated from the light source 230.

Figure 9:
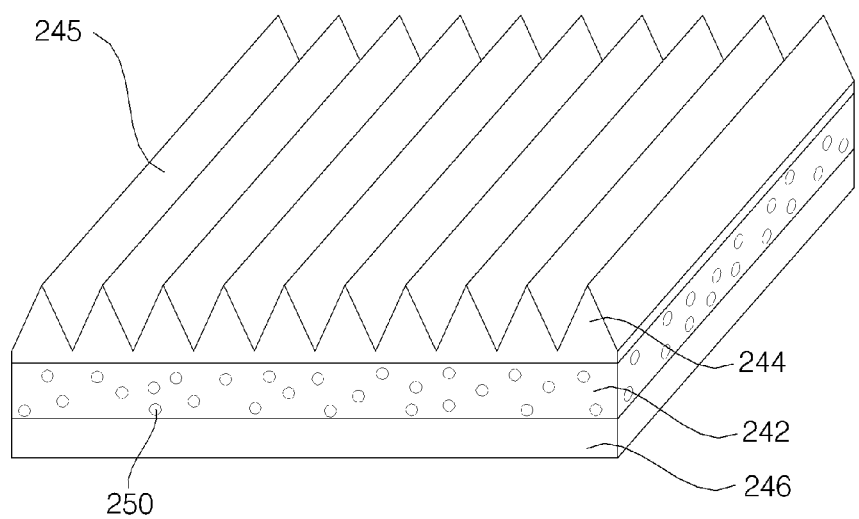
FIG. 9 is a perspective view illustrating a configuration of an optical sheet according to one embodiment.

Referring to FIGS. 9 to 11, a third layer 246 may be provided under the first layer 242.

The third layer 246 may be attached to the bottom of the first layer 242 and, for example, formed using an acrylic resin having favorable transparency and excellent heat resistance and mechanical properties, thus improving heat resistance of the optical sheet 240. Such acrylic resin may include, for example, polyacrylate or polymethyl methacrylate, without being particularly limited thereto. For instance, the third layer 246 may comprise at least one selected from polyethylene terephthalate, polycarbonate, polyethylene, polystyrene, polyester resin, polyether resin, epoxy resin, urethane resin, spiroacetyl resin, polybutadiene resin, polythiolpolyene resin, or the like, without being particularly limited thereto.

The third layer 246 may prevent the optical sheet 240 from being modified due to heat generated from the light source 230 and have excellent restoration, thus enabling the optical sheet 240 to return to an original shape thereof at room temperature, even when the optical sheet 240 is modified at a high temperature.

Furthermore, the third layer 246 may protect the optical sheet 240 from being scratched due to external impact or other physical force.

As shown in FIGS. 9 to 11, the third layer 246 may include the phosphor 250, without being particularly limited thereto. Alternatively, the first or second layer 242 or 244 has a first phosphor 252 while the third layer 246 has a second phosphor 254, wherein the first and second phosphors 252 and 254 may be phosphors emitting different wavelengths of light. For instance, the first phosphor 252 is a red phosphor while the second phosphor 254 is a green phosphor, and these phosphors may be excited by light emitted from the light source 230 to emit white light, without being particularly limited thereto.

FIG. 12 is an exploded perspective view illustrating a configuration of an optical sheet according to one embodiment.

Referring to FIG. 12, the optical sheet 240 according one embodiment may include a first optical sheet 260 and a second optical sheet 270.

As described above, the first optical sheet 260 may have a first layer 262 and a second layer 264, or the second layer 264 may have a third layer (not shown) and a fourth layer (not shown). Likewise, the second optical sheet 270 may have a first layer 272 and a second layer 274, or the second layer 274 may have a third layer (not shown) and a fourth layer (not shown), without being particularly limited thereto. In addition, at least one of the first and second optical sheets 260 and 270 may include a phosphor, without being particularly limited thereto.

The first and second optical sheets 260 and 270 may be secured to each other, using an adhesive, without being particularly limited thereto.

A first linear prism part 265 provided on the second layer 264 of the first optical sheet 260 may extend in a first direction, while a second linear prism part 275 provided on the second layer 274 of the second optical sheet 270 may extend in a second direction forming a first angle relative to the first direction. The first angle may be a right angle, without being particularly limited thereto.

For instance, after light is emitted from the light source 230 and enters the first and second optical sheets 260 and 270, the first and second optical sheets 260 and 270 may upwardly reflect 50% of the light oscillating in a direction, along which the light source 230 is arranged, thereby improving luminous efficacy. The first and second linear prism parts 265 and 275 provided on the first and second optical sheets 260 and 270, respectively, may increase refraction, thus improving luminous efficacy.

Figure 13:
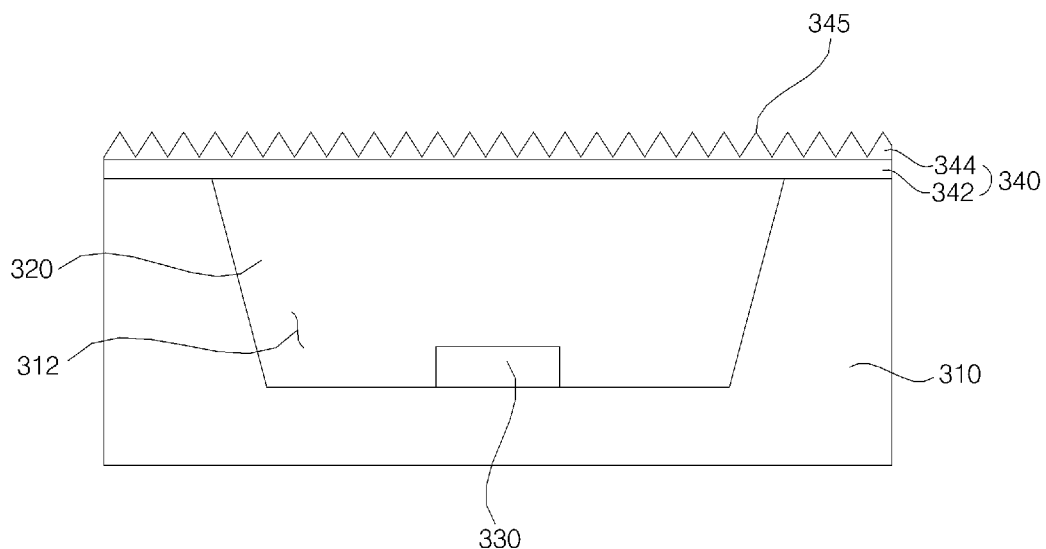
FIG. 13 is a cross-sectional view illustrating a configuration of a light-emitting device package according to one embodiment.
Figure 16:
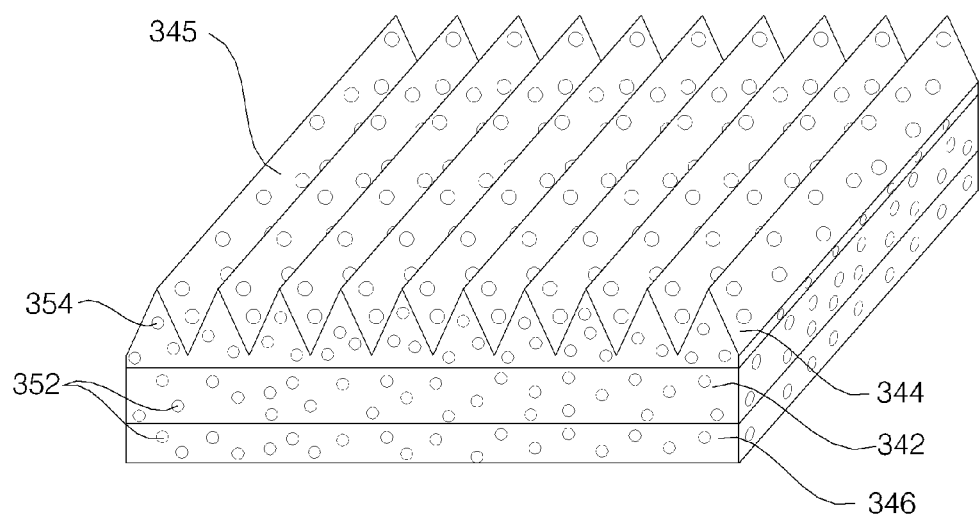
FIG. 16 is a perspective view illustrating a configuration of an optical sheet according to one embodiment.
Figure 17:
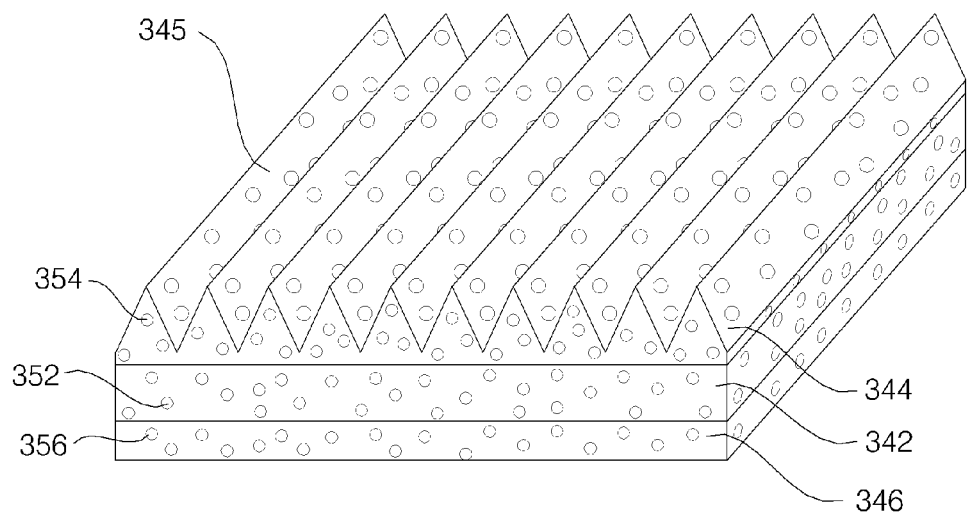
FIG. 17 is a perspective view illustrating a configuration of an optical sheet according to one embodiment.
Figure 18:
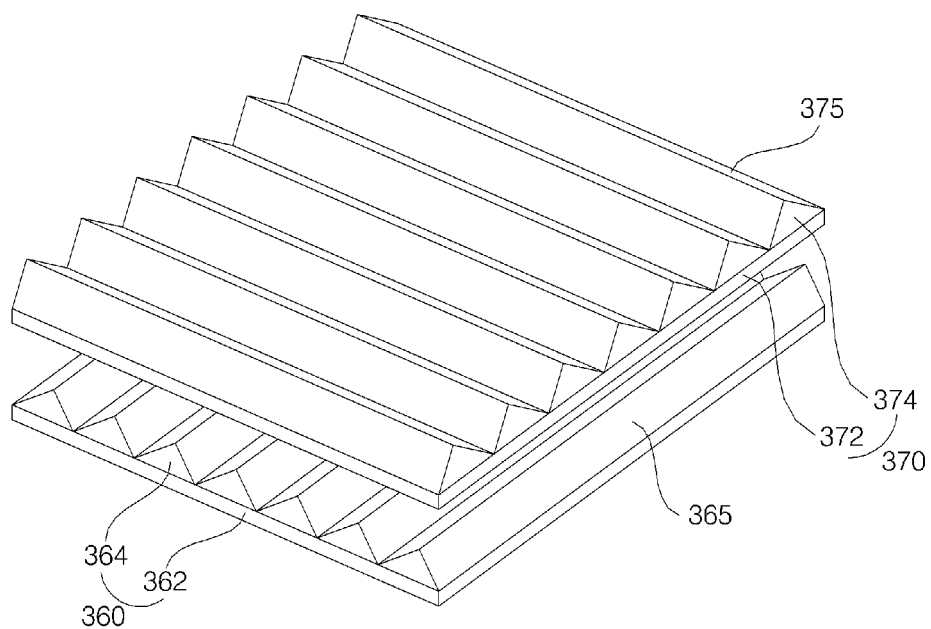
FIG. 18 is an exploded perspective view illustrating a configuration of an optical sheet according to one embodiment.

FIG. 13 is a cross-sectional view illustrating a configuration of a light-emitting device package according to one embodiment, FIGS. 14 to 17 are perspective views illustrating configurations of optical sheets according to embodiments, and FIG. 18 is an exploded perspective view illustrating a configuration of an optical sheet according to one embodiment.

Referring to FIG. 13, a light-emitting device package 300 according to one embodiment comprises: a body 310 having a cavity 312 formed therein; a light source 230 mounted to the bottom of the body 310; a resin layer 320 which fills the cavity 312 and is transmissive; and at least one optical sheet 340 provided on the resin layer 320, wherein each optical sheet 340 has a first layer 342, a second layer 344 which is provided on the first layer 342 and includes a plurality of linear prisms 345, wherein the first layer 342 has a first phosphor 352 while the second layer 344 has a second phosphor 354, and wherein the first and second phosphors 352 and 354 emit different wavelengths of light.

Meanwhile, the body 310, cavity 312, resin layer 320 and light source 330 are substantially the same as described above and, therefore, a detailed explanation thereof is omitted.

Figure 14:
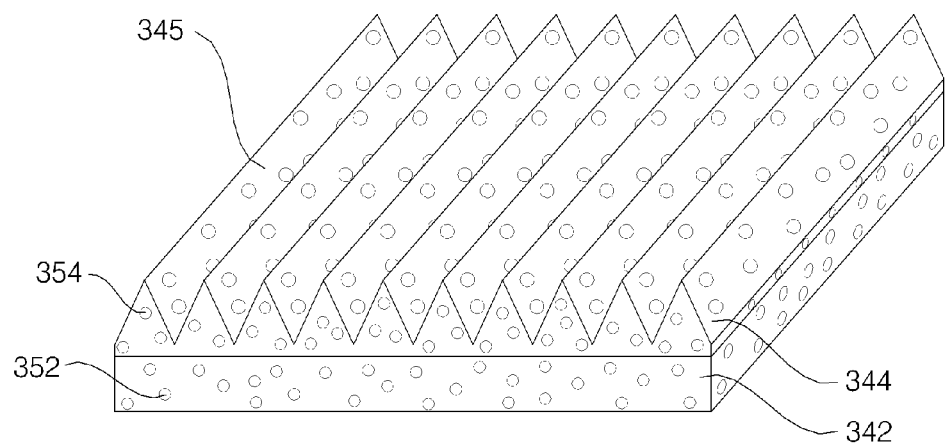
FIG. 14 is a perspective view illustrating a configuration of an optical sheet according to one embodiment.

As shown in FIG. 14, the first layer 342 may have the first phosphor 352 while the second layer 344 has the second phosphor 354, wherein the first and second phosphors 352 and 354 may emit different wavelengths of light.

For instance, the first phosphor 352 is a red phosphor while the second phosphor 354 is a green phosphor, and these phosphors may be excited by light emitted from the light source 330, without being particularly limited thereto.

The first layer has the first phosphor 352, the second layer 344 has the second phosphor 354, and these phosphors 352 and 354 emit different wavelengths of light, which in turn enables the light-emitting device package 300 to uniformly emit light and realize white light with high reliability.

A process of distributing the first and second phosphors 352 and 354 on the optical sheet is described above and a detailed description thereof is omitted.

Figure 15:
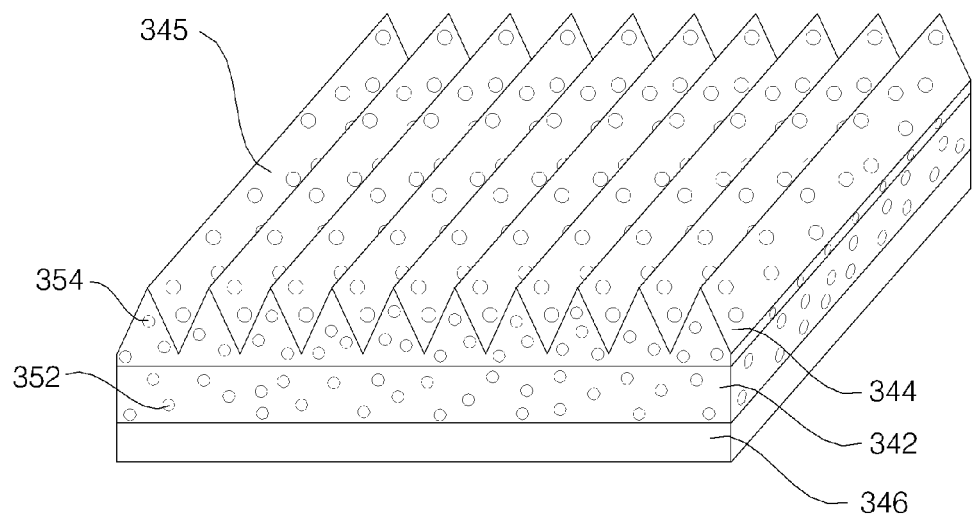
FIG. 15 is a perspective view illustrating a configuration of an optical sheet according to one embodiment.

Referring to FIGS. 15 to 17, a third layer 342 may be provided under the first layer 342.

The third layer 346 may be attached to the bottom of the first layer 342 and, for example, be formed using an acrylic resin having favorable transparency and excellent heat resistance and mechanical properties, thus improving heat resistance of the optical sheet 340. Such acrylic resin may include, for example, polyacrylate or polymethyl methacrylate, without being particularly limited thereto. For instance, the third layer 346 may comprise at least one selected from polyethylene terephthalate, polycarbonate, polyethylene, polystyrene, polyester resin, polyether resin, epoxy resin, urethane resin, spiroacetyl resin, polybutadiene resin, polythiolpolyene resin, or the like, without being particularly limited thereto.

The third layer 346 may prevent the optical sheet 340 from being modified by heat generated from the light source 330 and have excellent restoration, thus enabling the optical sheet 340 to return to an original shape thereof at room temperature, even when the optical sheet 340 is modified at a high temperature.

Furthermore, the third layer 346 may protect the optical sheet 340 from being scratched due to external impact or other physical force.

As shown in FIGS. 15 to 17, the third layer 346 may include a phosphor, without being particularly limited thereto. More particularly, the first layer 342 has a first phosphor 352 and the second layer has a second phosphor 354, while the third layer 346 has a third phosphor 356, wherein the first, second and third phosphors 352, 354 and 356 may be phosphors emitting different wavelengths of light. For instance, the first phosphor 352 is a blue phosphor, the second phosphor 354 is a red phosphor and the third phosphor 356 is a green phosphor, wherein these phosphors may be excited by light emitted from the light source 330 to emit white light, without being particularly limited thereto.

FIG. 18 is an exploded perspective view illustrating a configuration of an optical sheet according to one embodiment.

Referring to FIG. 18, the optical sheet 340 according one embodiment may include a first optical sheet 360 and a second optical sheet 370.

As described above, the first optical sheet 360 may have a first layer 362 and a second layer 364, or the second layer 364 may have a third layer (not shown) and a fourth layer (not shown). The second optical sheet 370 may also have a first layer 372 and a second layer 374, or the second layer 374 may have a third layer (not shown) and a fourth layer (not shown), without being particularly limited thereto. In addition, at least one of the first and second optical sheets 360 and 370 may include a phosphor, without being particularly limited thereto.

The first and second optical sheets 360 and 370 may be secured to each other, using an adhesive, without being particularly limited thereto.

A first linear prism part 365 provided on the second layer 364 of the first optical sheet 360 may extend in a first direction, while a second linear prism part 375 provided on the second layer 374 of the second optical sheet 270 may extend in a second direction forming a first angle relative to the first direction. The first angle may be a right angle, without being particularly limited thereto.

For instance, after light is emitted from the light source 330 and enters the first and second optical sheets 360 and 370, the first and second optical sheets 360 and 370 may upwardly reflect 50% of the light oscillating in a given direction, along which the light source 330 is arranged, thereby improving luminous efficacy. The first and second linear prism parts 365 and 375 provided on the first and second optical sheets 360 and 370, respectively, may increase refracted light and thus improve luminous efficacy.

Figure 19:
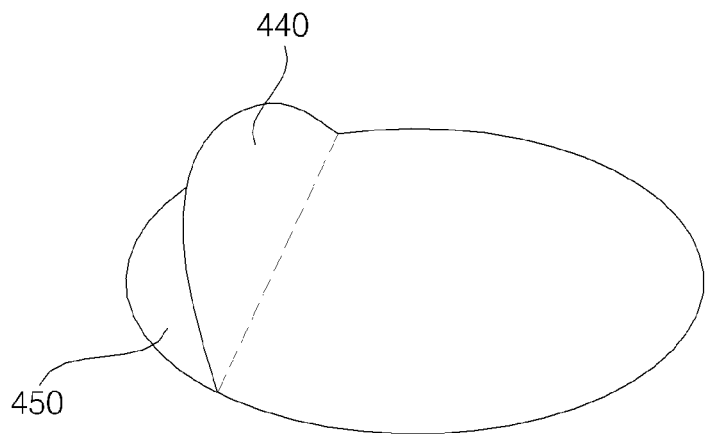
FIG. 19 is a conceptual view illustrating a process of preparing an optical sheet according to one embodiment.
Figure 20:
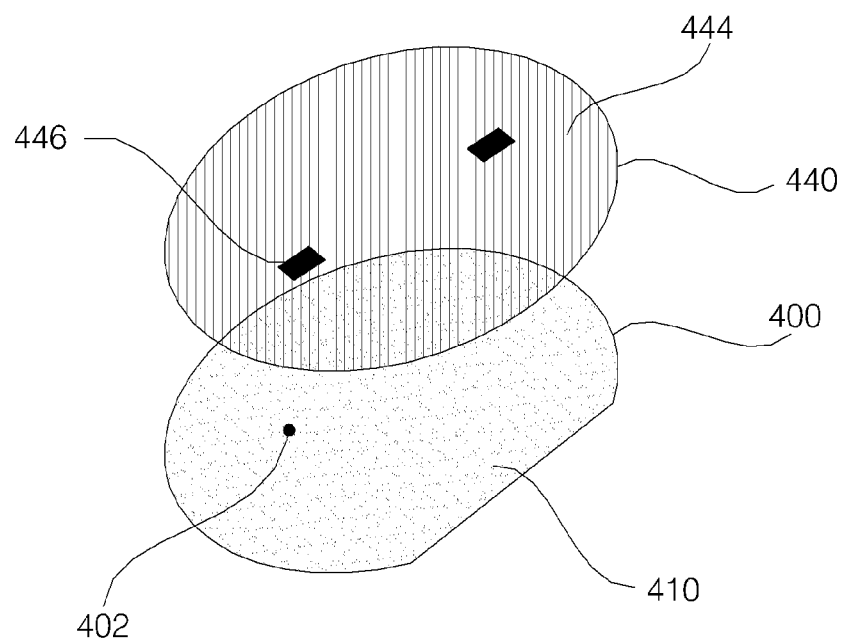
FIG. 20 is a conceptual view illustrating a process of fabricating a light-emitting device package according to one embodiment.

FIGS. 19 and 20 each schematically illustrate processes of preparing an optical sheet and a light-emitting device package, respectively, according to one embodiment.

More particularly, FIGS. 19 and 20 illustrate a process of fabricating a light-emitting device package, e.g., a wafer level package. However, without being particularly limited to the foregoing embodiment, the optical sheet described above may be separately mounted on a single package.

FIG. 19 illustrates a method for attaching an optical sheet 440 to a silicon wafer 400, wherein the silicon wafer 400 is fabricated by etching a plurality of bodies 410 based on anisotropic etching properties of silicon, placing a light source part in a cavity of each body 410 and filling the cavities with a sealant.

The optical sheet 440 is adhered to the silicon wafer 400 such that a prism pattern 444 faces upward, wherein the optical sheet 440 may have a first alignment mark 446 while the silicon wafer 400 may have a second alignment mark 402 at a position corresponding to the first alignment mark 446, so as to match alignment between the optical sheet 440 and the silicon wafer 400.

After coinciding the first alignment mark 446 of the optical sheet 440 with the second alignment mark 402 of the silicon wafer 400, the optical sheet is attached to the silicon wafer 400.

The method of attaching the optical sheet 440 to the silicon wafer 400 may be selected from, for example: a process that includes coating an adhesive onto a plurality of bodies 410 provided on the silicon wafer 400, adhering the optical sheet 440 thereto and heating the same; a process that includes placing the optical sheet 440 on the silicon wafer 400, and then, applying a predetermined pressure under heating; a process that includes patterning an adhesive on a rear surface of the optical sheet 440 to match with a plurality of bodies 410 provided on the silicon wafer 400, adhering the optical sheet 440 thereto and heating the same, and so forth.

After attaching the optical sheet 440 to the silicon wafer 400, the silicon wafer 400 is cut along the plural bodies 410, thus easily fabricating the light-emitting device package described above.

Figure 21:
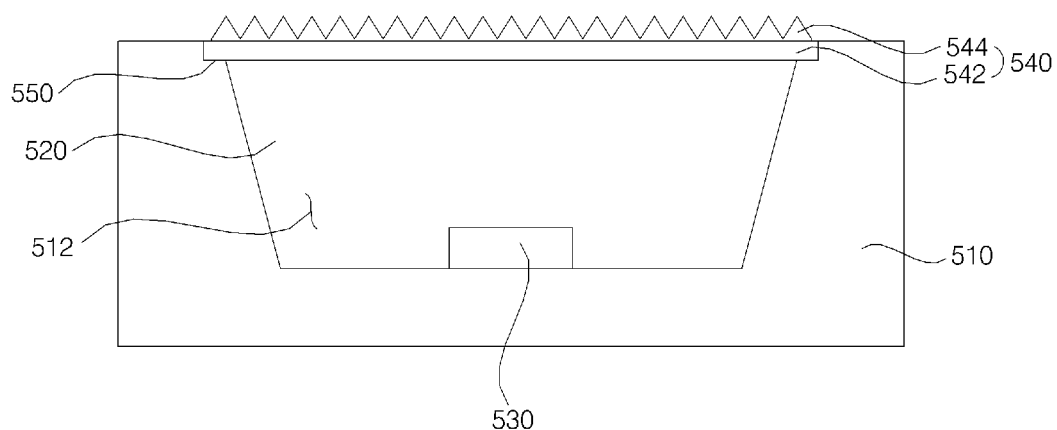
FIG. 21 is a cross-sectional view illustrating a light-emitting device package according to one embodiment.
Figure 22:
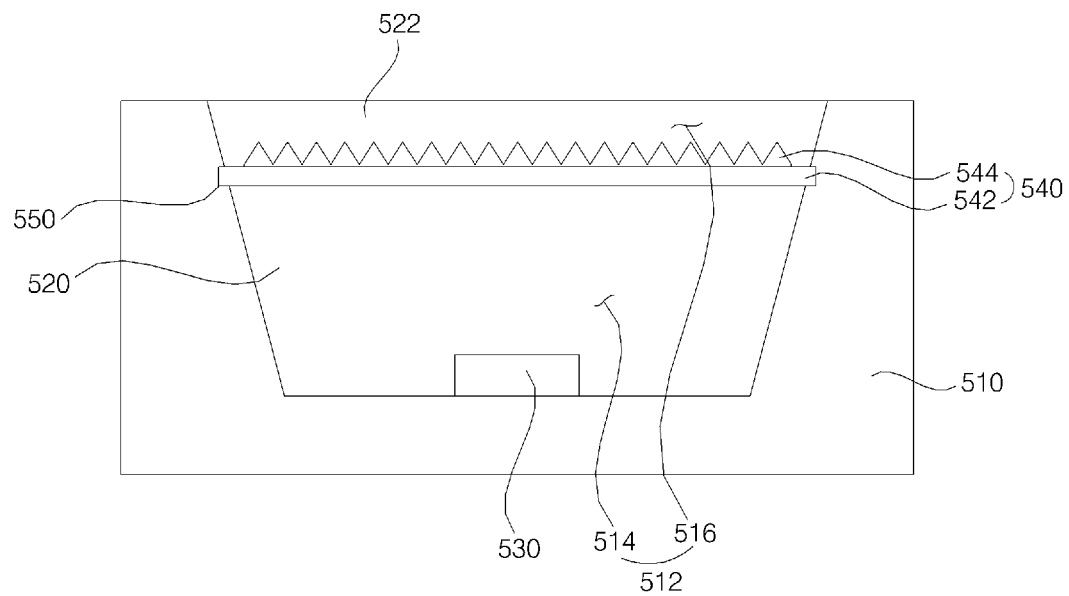
FIG. 22 is a cross-sectional view illustrating a light-emitting device package according to one embodiment.

FIGS. 21 and 22 are cross-sectional views illustrating cross-sections of a light-emitting device package according to one embodiment.

Referring to FIGS. 21 and 22, a light-emitting device 500 may include a step 550 formed on the inner side of a cavity 512, and an optical sheet 540 may be fixed to the step 550. Since the body 510, light source 530 and optical sheet 540 are substantially the same as described above, only different features will be described hereinafter.

The step 550 may be provided on at least one region of the inner side of the cavity 512. The step 550 may be formed by first forming the cavity 512 on the body 510 and then removing at least one region of the inner side of the cavity 512, without being particularly limited thereto. Further, the step 550 may be formed throughout the inner side of the cavity 512, without being particularly limited thereto.

The optical sheet 540 may be fixed to the step 550. For instance, after the optical sheet 540 having a predetermined size is placed on the step 550, the optical sheet 540 may be fixed using an adhesive resin. Otherwise, the optical sheet 540 coated with an adhesive resin may be positioned on the step 550 and the optical sheet 540 may be fixed by curing the adhesive resin, without being particularly limited thereto.

Since the step 550 is formed on the inner side of the cavity 512 and the optical sheet 540 is fixed to the step 550, the optical sheet 540 may be reliably secured.

Meanwhile, as shown in FIG. 22, since the step 550 is formed at the middle of a height of the cavity 512 and the optical sheet 540 is fixed to the step 550, the cavity 512 may be separated into a first cavity 514 and a second cavity 516. Here, the first cavity 514 may have a first resin layer 520 formed therein while the second cavity 516 includes a second resin layer 522.

The second resin layer 522 may comprise silicone, epoxy or other resin materials and be formed by filling the cavity 512 with such a resin material, and then, UV or heat curing the same, without being particularly limited thereto. The second resin layer 522 may be made of the same material as used for the first resin layer 520, without being particularly limited thereto.

By forming the second resin layer 522 on the optical sheet 540, the optical sheet 540 may be protected from damage caused by external environments.

Meanwhile, the second resin layer 522 may include a second phosphor (not shown). For example, the optical sheet 540 may have a first phosphor (not shown) while the second resin layer 522 may have the second phosphor (not shown), wherein the first and second phosphors (not shown) may be different from each other.

Figure 23:
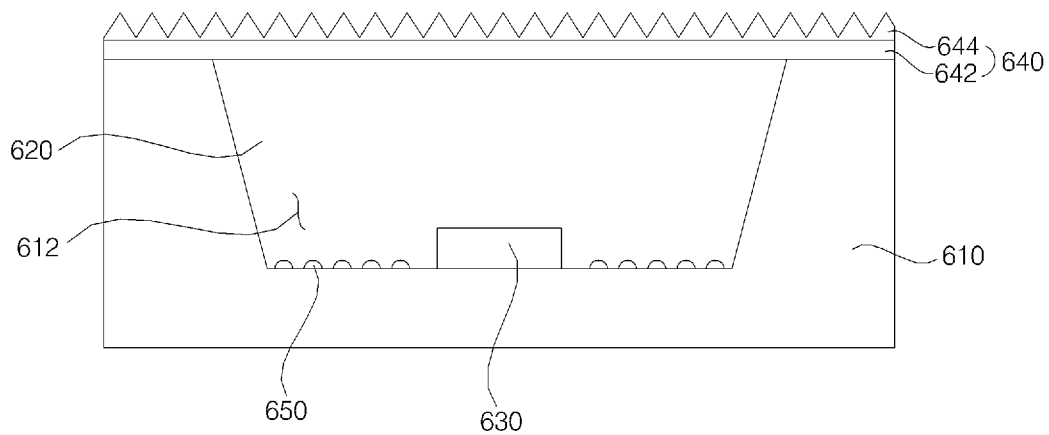
FIG. 23 is a cross-sectional view illustrating a light-emitting device package according to one embodiment.

FIG. 23 is a cross-sectional view illustrating a cross-section of a light-emitting device according to one embodiment.

Referring to FIG. 23, a light-emitting device package 600 comprise: a body 610 having a cavity 612; a light source 630 mounted to the bottom of the body 610; and an optical sheet 640 provided on the body 610 to cover the cavity 612. Since the body 610, light source 630 and optical sheet 640 are substantially the same as described above, only different features will be described hereinafter.

The light-emitting device package 610 shown in FIG. 23 may further include an uneven part 650 formed on the bottom of the body 610 on which the light source 630 is mounted.

The uneven part 650 may be formed in a uniform shape and a predetermined pattern or, otherwise, have a non-uniform shape.

The uneven part 650 may allow the light-emitting device package to have a wider visible angle by scattering light emitted by the light source 630, and enable color mixing to be easily conducted, so that colors generated from individual light-emitting device packages 600 may be naturally combined when such light-emitting device packages 600 are connected together to form an array, thereby improving color rendering.

The uneven part 650 may include at least one of a concave part or a protrusion part. In this regard, the protrusion part may be protruded above the bottom of the cavity 612 while the concave part may be recessed below the bottom of the cavity 612, without being particularly limited thereto.

Figure 24:
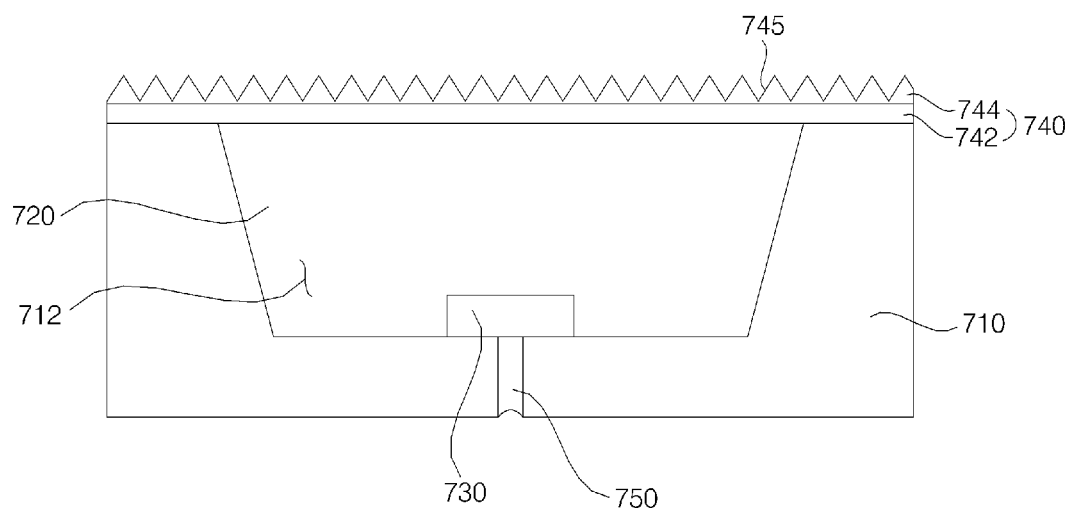
FIG. 24 is a cross-sectional view illustrating a light-emitting device package according to one embodiment.

FIG. 24 is a cross-sectional view illustrating a configuration of a light-emitting device package according to one embodiment.

A light-emitting device package 700 shown in FIG. 24 may have a hole 750 formed on the bottom of a body 710 and the hole 750 may be positioned under a light source 730. Since the body 710, cavity 720 and light source 730 are substantially the same as described above, a detailed description thereof is omitted.

The light source 730 may be an LED and such an LED may be electrically connected to an electrode (not shown) provided on the body 710.

In this case, the light source 730 and the electrode (not shown) may be electrically connected together via the hole 750.

In addition, the hole 750 may not only allow the electrical connection described above but also serve as a heat sink to dissipate heat generated from the light source 730 to the outside.

Although not illustrated in the drawing, the hole 750 may be connected to a heat sink plate (not shown) made of metal at the bottom thereof. As such, since the hole 750 is connected to a metal-based heat sink plate having high thermal conductivity, heat dissipation is enhanced.

Figure 25:
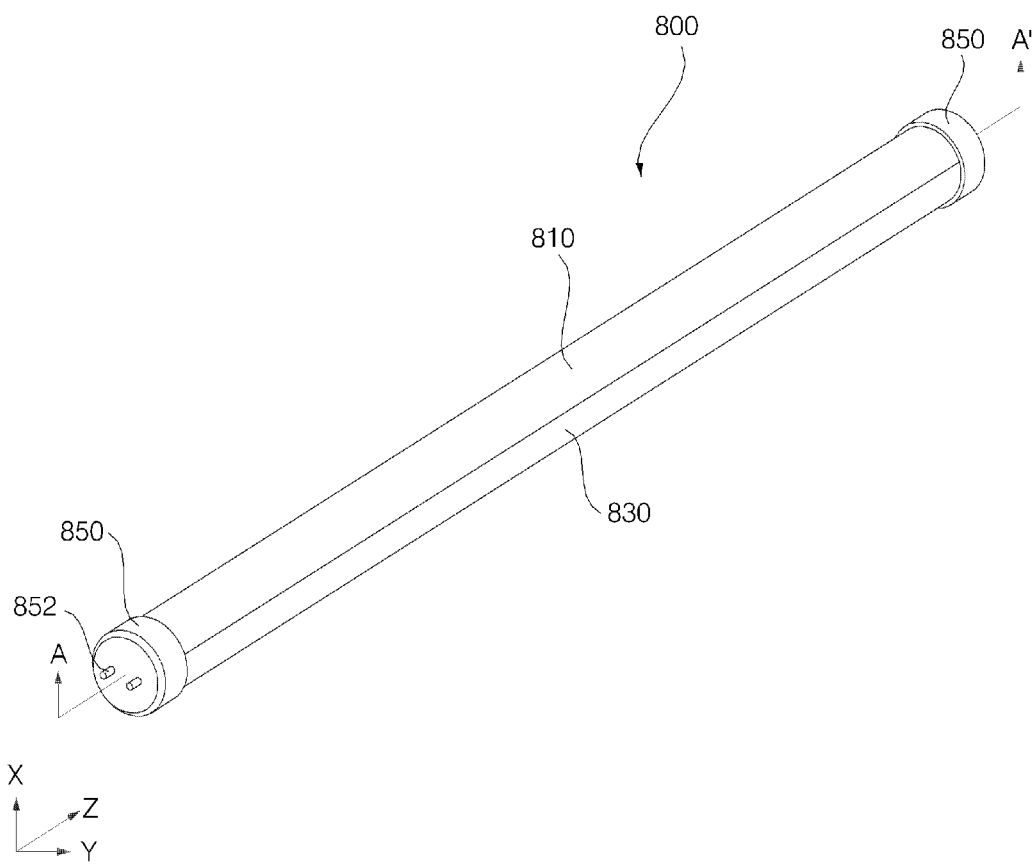
FIG. 25 is a perspective view illustrating a lighting instrument equipped with a light-emitting device package according to one embodiment.
Figure 26:
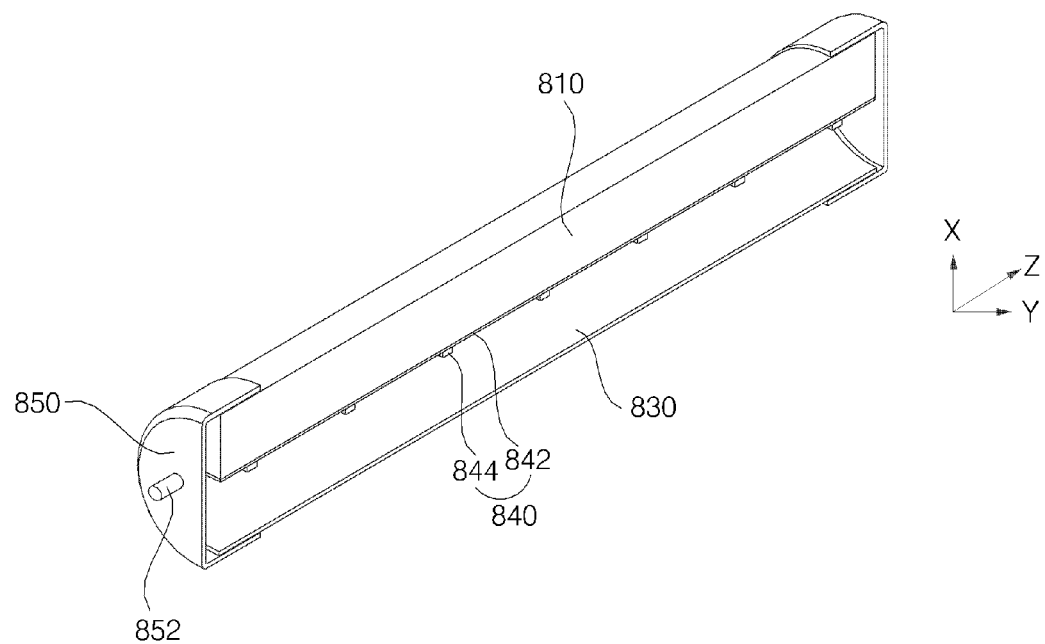
FIG. 26 is a cross-sectional view showing a cross section A-A' of the lighting instrument shown in FIG. 25.

FIG. 25 is a perspective view illustrating a lighting instrument equipped with a light-emitting device package according to one embodiment, and FIG. 26 is a cross-sectional view showing a cross section A-A' of the lighting instrument shown in FIG. 25.

In order to describe the shape of a lighting instrument 800 according to one embodiment in detail, the lighting instrument 800 is described in terms of a length direction Z, a horizontal direction Y perpendicular to the length direction Z, and a height direction X perpendicular to both the length direction Z and the horizontal direction Y.

That is, FIG. 26 is a cross-sectional view when viewing in the horizontal direction Y after cutting the lighting instrument 800 along a plane formed of the length direction Z and the height direction X.

Referring to FIGS. 25 and 26, the lighting instrument 800 may include a body 810, a cover 830 coupled with the body 810, and end caps 850 provided to both ends of the body 810.

The body 810 may be connected with a light-emitting device module 840 at bottom side thereof and, in order to discharge heat generated from a light-emitting device package 844 to the outside through the top of the body 810, the body 810 may be made of metal materials having excellent thermal conductivity and heat dissipation effects.

The light-emitting device package 844 may be mounted on a PCB 842 with multiple colors and in multiple rows to form an array, and may be spaced from one another by a predetermined interval or, if necessary, by different distances, to control brightness. Such PCB 842 may be a metal core PCB (MPPCB) or PCB made of FR4.

The light-emitting device package 844 may be coupled with an optical sheet (not shown). If such an optical sheet (not shown) is provided, the light-emitting device package 844 may emit light with enhanced light uniformity and distribution. Moreover, since the optical sheet (not shown) has a linear prism (not shown), collimation of light may be improved, which in turns enhances brightness of the light-emitting device package 844.

The cover 830 may take the shape of a circle to surround the bottom of the body 810, without being limited thereto.

The cover 830 protects the light-emitting device module 840 from foreign substances. In addition, the cover 830 prevents glare occurred by the light-emitting device package 844 and includes diffusion particles to uniformly discharge light to the outside. In addition, a prism pattern or the like may be formed on at least one of the inner and outer surfaces of the cover 830. Alternatively, a phosphor may be applied onto at least one of the inner and outer surfaces of the cover 830.

Meanwhile, the cover 830 should exhibit superior light transmittance to discharge light emitted by the light-emitting device package 844 through the cover 830 to the outside, and the cover 830 should exhibit sufficient heat resistance to endure heat generated from by the light-emitting device package 844. Preferably, the cover 830 is composed of a material including polyethylene terephthalate (PET), polycarbonate (PC) or polymethyl methacrylate (PMMA) and the like.

The end cap 850 is arranged on both ends of the body 810 and may be used to seal a power device (not shown). In addition, the end cap 850 is provided with a power pin 852, allowing the lighting instrument 800 to be applied to a terminal from which a conventional fluorescent light has been removed, without using any additional device.

Figure 27:
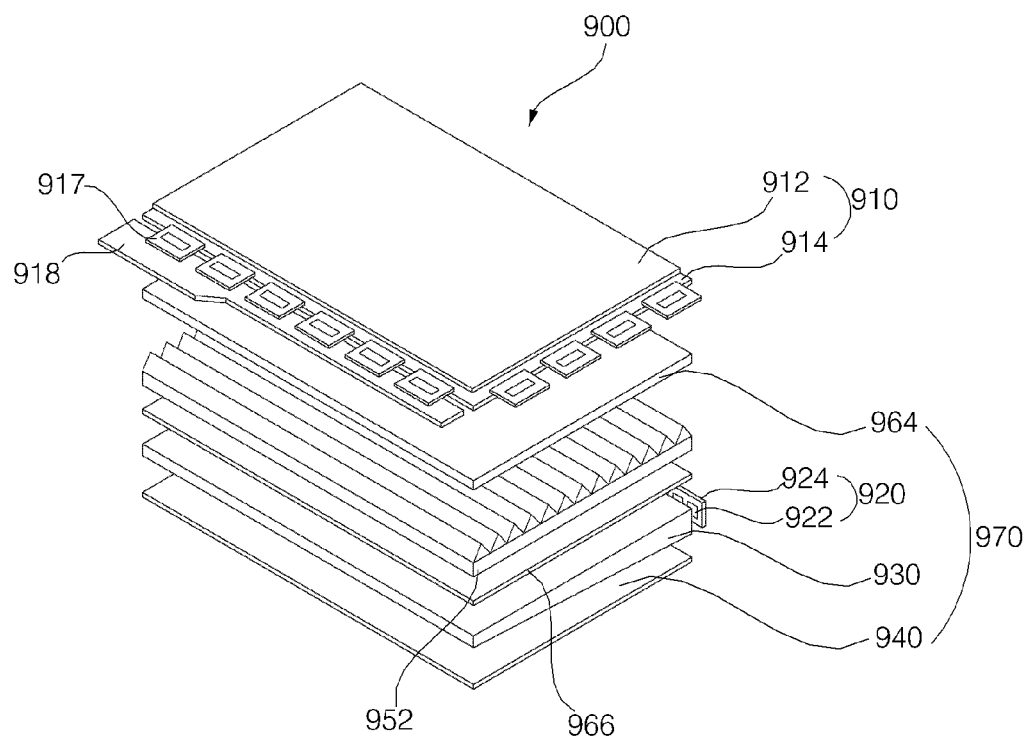
FIG. 27 is an exploded perspective view illustrating a backlight unit equipped with a light-emitting device package according to one embodiment.

FIG. 27 is an exploded perspective view illustrating a backlight unit equipped with a light-emitting device package according to one embodiment.

FIG. 27 illustrates an edge-light type liquid crystal display device 900 which includes a liquid crystal display panel 910 and a backlight unit 970 to supply light to the liquid crystal display panel 910.

The liquid crystal display panel 910 displays an image using light supplied from the backlight unit 970. The liquid crystal display panel 910 includes a color filter substrate 912 and a thin film transistor substrate 914 which face each other through liquid crystal interposed therebetween.

The color filter substrate 912 can render color images to be displayed through the liquid crystal display panel 910.

The thin film transistor substrate 914 is electrically connected to a printed circuit board 918 on which a plurality of circuit components is mounted through a driving film 917. The thin film transistor substrate 914 responds to drive signals supplied from the printed circuit board 918 and may apply drive voltage from the printed circuit board 418 to liquid crystals.

The thin film transistor substrate 914 includes a thin film transistor and a pixel electrode formed as a thin film on other substrates composed of a transparent material such as glass or plastic.

The backlight unit 970 includes; a light-emitting device module 920 to emit light, a light guide plate 930 to convert light emitted by the light-emitting device module 920 into surface light and supply the light to the liquid crystal display panel 910, a plurality of films 950, 766 and 764 to uniformize brightness distribution of light emitted by the light guide plate 930 and improve vertical incidence, and a reflective sheet 940 to reflect light emitted to the back of the light guide plate 930 to the light guide plate 930.

The light-emitting device module 920 includes a plurality of light-emitting device packages 924 and a PCB 922 on which the light-emitting device packages 924 are mounted to form an array.

Specifically, the light-emitting device package 924 may include an optical sheet (not shown) and the optical sheet may improve uniformity and brightness of light emitted by the light-emitting device package 924.

Meanwhile, a backlight unit 970 includes a diffusion film 966 to diffuse light projected from the light guide plate 930 toward the liquid crystal display panel 910, a prism film 950 to concentrate the diffused light and thus improve vertical incidence, and a protective film 964 to protect the prism film 950.

Figure 28:
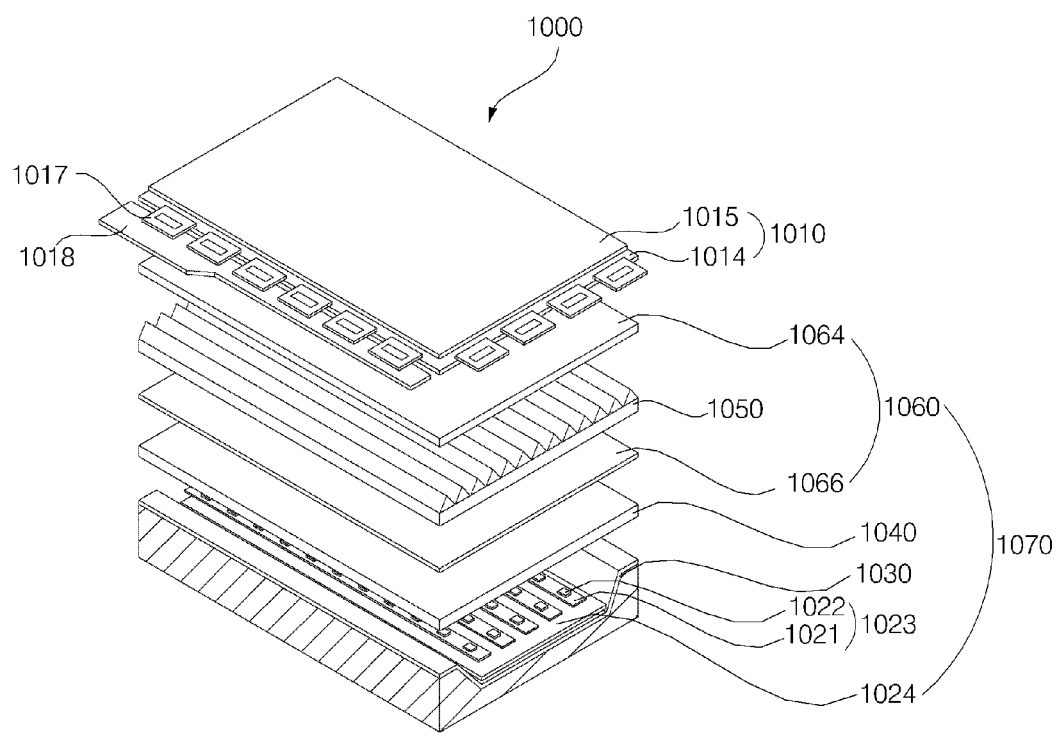
FIG. 28 is an exploded perspective view illustrating a backlight unit equipped with a light-emitting device package according to one embodiment.

FIG. 28 is an exploded perspective view illustrating a liquid crystal display including the light emitting device according to one embodiment. However, the contents illustrated and described in FIG. 27 are not mentioned in detail.

FIG. 28 illustrates a direct-type liquid crystal display device 1000 which includes a liquid crystal display panel 1010 and a backlight unit 1070 to supply light to the liquid crystal display panel 1010.

The liquid crystal display panel 1010 is substantially the same as described in FIG. 27 and a detailed explanation thereof is omitted.

The backlight unit 1070 includes a plurality of light-emitting device modules 1023, a reflective sheet 1024, a lower chassis 1030 in which the light-emitting device modules 1023 and the reflective sheet 1024 are accepted, a diffusion plate 1040 arranged on the light-emitting device modules 1023, and a plurality of optical films 1060.

Each light-emitting device module 1023 includes a plurality of light-emitting device packages 1022 and a PCB 1021 on which the light-emitting device packages 1022 are mounted to form an array.

Specifically, the light-emitting device package 1022 may include an optical sheet (not shown) having a phosphor and the optical sheet may improve uniformity and brightness of light emitted by the light-emitting device package 1022.

The reflective sheet 1024 reflects light emitted from the light-emitting device package 1022 toward the liquid crystal display panel 1010, so as to improve luminous efficacy.

Meanwhile, light emitted from the light-emitting device module 1023 is projected onto the diffusion plate 1040 and an optical film 1060 is arranged on top of the diffusion plate 1040. The optical film 1060 includes a diffusion film 1066, a prism film 1050 and a protective film 1064.

The light-emitting device package according embodiments of the present invention is not limited to configurations and processes illustrated in the fore-mentioned embodiments. Further, those skilled in the art will appreciate that a variety of combinations and modifications of partially or entirely selected parts of respective embodiments are possible.

Although the embodiments of the present invention have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light-emitting device package, comprising:
a body having a cavity formed therein;
a light source mounted in the cavity;
a first resin layer which fills the cavity and is transmissive;
a first optical sheet provided on the first resin layer;
a second optical sheet provided on the first optical sheet; and
a second resin layer on the second optical sheet,
wherein the first and second optical sheets each have a first layer, and a second layer which is provided on the first layer and has a plurality of linear prisms,
wherein the first layer has a first refractive index and the first resin layer has a second refractive index,
wherein the first refractive index is equal to or greater than the second refractive index,
wherein the first resin layer is composed of silicone, epoxy or other resin materials and is formed by filling the cavity with such a resin material and UV or heat curing the same,
wherein a vertical cross-section of the linear prisms has a shape of a triangle,
wherein a boundary between the first layer and the second layer is flat,
wherein the first and second optical sheets each include a first phosphor and the second resin layer includes a second phosphor, and
wherein the first and second phosphors are different from each other.

2. The light-emitting device package according to claim 1, wherein the plural linear prisms form a plurality of prism patterns arranged in parallel to one another.

3. The light-emitting device package according to claim 1, wherein the linear prisms have a pitch ranging from 30 to 70 μm.

4. The light-emitting device package according to claim 1, wherein each linear prism has a height ranging from 20 to 40 μm.

5. The light-emitting device package according to claim 1, wherein the first and second optical sheets each include a third layer formed under the first layer.

6. The light-emitting device package according to claim 1, wherein the first and second optical sheets each comprise at least one selected from polyethylene terephthalate, polycarbonate, polyethylene, polystyrene, polyester resin, polyether resin, epoxy resin, urethane resin, spiroacetyl resin, polybutadiene resin or polythiopolyene resin.

7. A light-emitting device package, comprising:
a body having a cavity formed therein;
a light source mounted in the cavity;
an uneven part formed on the bottom of the body on which the light source is mounted;
a first resin layer which fills the cavity and is transmissive;
a first optical sheet provided on the first resin layer; and
a second optical sheet provided on the first optical sheet,
wherein the first and second optical sheets each include a first layer, and a second layer which is provided on the first layer and has a plurality of linear prisms,
wherein any one of the first and second layers includes a phosphor,
wherein the first resin layer is composed of silicone, epoxy or other resin materials and is formed by filling the cavity with such a resin material and UV or heat curing the same,
wherein a vertical cross-section of the linear prisms has a shape of a triangle, wherein a boundary between the first layer and the second layer is flat, and wherein the uneven part includes at least one of a concave part or protrusion part.

8. The light-emitting device package according to claim 7, wherein the first and second optical sheets each further include a third layer formed under the first layer and arranged between the first layer and the first resin layer.

9. The light-emitting device package according to claim 8, wherein the third layer includes a phosphor.

10. A light-emitting device package, comprising:
a body having a cavity formed therein;
a hole formed in the bottom of a body;
a light source mounted in the cavity;
an uneven part formed on the bottom of the body on which the light source is mounted;
a first resin layer which fills the cavity and is transmissive;
a first optical sheet provided on the first resin layer; and
a second optical sheet provided on the first optical sheet,
wherein the first and second optical sheets each include a first layer, and a second layer which is provided on the first layer and has a plurality of linear prisms,
wherein the first layer includes a first phosphor while the second layer includes a second phosphor,
wherein the first and second phosphors emit different wavelengths of light,
wherein the first resin layer is composed of silicone, epoxy or other resin materials and is formed by filling the cavity with such a resin material and UV or heat curing the same,
wherein a vertical cross-section of the linear prisms has a shape of a triangle,
wherein a boundary between the first layer and the second layer is flat,
wherein the uneven part includes at least one of a concave part or protrusion part, and
wherein the hole is positioned under the light source.

11. The light-emitting device package according to claim 10, wherein the first and second optical sheets each further include a third layer formed under the first layer and arranged between the first layer and the first resin layer.

12. The light-emitting device package according to claim 11, wherein the third layer includes a phosphor.

13. The light-emitting device package according to claim 11, wherein the third layer includes a third phosphor, and wherein the first, second and third phosphors emit different wavelengths of light.

14. The light emitting device package according to claim 1, further comprising an uneven part formed on the bottom of the body on which the light source is mounted, wherein the uneven part includes at least one of a concave part or protrusion part.

15. The light-emitting device package according to claim 7, further comprising a second resin layer on the second optical sheet, wherein the second resin layer includes a phosphor.

16. The light-emitting device package according to claim 10, further comprising a second resin layer on the second optical sheet, wherein the second resin layer includes a phosphor.

17. The light-emitting device package according to claim 1, further comprising a hole formed in the bottom of a body, wherein the hole is positioned under a light source.

18. The light-emitting device package according to claim 7, further comprising a hole formed in the bottom of a body, wherein the hole is positioned under a light source.

19. The light-emitting device package according to claim 1, wherein the plural linear prisms form an isosceles triangle.

20. The light-emitting device package according to claim 7, wherein the plural linear prisms form an isosceles triangle.

* * * * *